(12) United States Patent
Tang et al.

(10) Patent No.: US 7,157,119 B2
(45) Date of Patent: Jan. 2, 2007

(54) METHOD AND COMPOSITIONS FOR APPLYING MULTIPLE OVERLYING ORGANIC PIGMENTED DECORATIONS ON CERAMIC SUBSTRATES

(75) Inventors: Robert H. Tang, Murrysville, PA (US); Yingchao Zhang, Murrysville, PA (US); Richard W. Morales, South Milwaukee, WI (US); Alan E. Wang, Gibsonia, PA (US); Donald P. Hart, Jr., Pittsburgh, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 195 days.

(21) Appl. No.: 10/465,486

(22) Filed: Jun. 19, 2003

(65) Prior Publication Data

US 2004/0058144 A1    Mar. 25, 2004

Related U.S. Application Data

(60) Provisional application No. 60/391,555, filed on Jun. 25, 2002.

(51) Int. Cl.
*B05D 1/36* (2006.01)
*B05D 3/02* (2006.01)
*C08L 63/00* (2006.01)

(52) U.S. Cl. .................. 427/407.1; 427/402; 427/416; 427/385.5; 427/386; 523/440; 523/443; 523/444

(58) Field of Classification Search ................ 428/332, 428/338, 339, 413, 414; 427/402, 407.1, 427/416, 418, 419.1, 419.2; 523/400, 440, 523/443, 444
See application file for complete search history.

(56) References Cited

U.S. PATENT DOCUMENTS

| | | | |
|---|---|---|---|
| 3,607,349 A | 9/1971 | Dereich | 117/38 |
| 3,854,267 A * | 12/1974 | Weiant et al. | 52/742.16 |
| 4,171,228 A | 10/1979 | Lowrey | 106/288 B |
| 5,478,885 A * | 12/1995 | Masse et al. | 525/92 H |
| 5,736,602 A | 4/1998 | Crocker et al. | 524/494 |
| 5,770,647 A * | 6/1998 | Watanabe et al. | 524/507 |
| 6,207,077 B1 * | 3/2001 | Burnell-Jones | 252/301.36 |
| 6,340,519 B1 | 1/2002 | Tanaka et al. | 428/327 |
| 6,403,222 B1 * | 6/2002 | Harrison | 428/418 |
| 6,451,876 B1 * | 9/2002 | Koshy | 523/219 |
| 6,709,756 B1 * | 3/2004 | Kuwabara et al. | 428/448 |

* cited by examiner

*Primary Examiner*—Michael J. Feely
(74) *Attorney, Agent, or Firm*—Diane R. Meyers; Dennis G. Millman

(57) ABSTRACT

A pigmented curable composition adapted for decorating ceramic substrates (e.g., glass bottles) comprises curable organic binder and solid spherical particles (glass or polymer) having diameters of 10 to 50 microns for facilitating overprinting of additional layers. The preferred embodiment comprises: (a) reactive organic resin component in which epoxy groups comprise the major reactive functionality; (b) amino-functional curing agent; (c) blocked polyisocyanate; and (d) 5 to 35 percent solid spherical particles having diameters of 10 to 50 microns.

40 Claims, No Drawings

METHOD AND COMPOSITIONS FOR APPLYING MULTIPLE OVERLYING ORGANIC PIGMENTED DECORATIONS ON CERAMIC SUBSTRATES

CROSS-REFERENCE TO RELATED APPLICATION

This application claims priority under 35 U.S.C. § 119 to U.S. Provisional Application Ser. No. 60/391,555, filed Jun. 25, 2002.

BACKGROUND OF THE INVENTION

This invention relates to decorating ceramic objects, particularly glass articles such as glass containers. As used herein "glass" should be understood to refer to a wide range of ceramic substrates, including glass. Although decorating glass containers, particularly bottles, is a use for which the invention finds particular utility, it should be understood that the shape of the substrate does not affect the utility of the invention. Decorating may refer to printing discrete words or designs onto the substrate or onto a previously applied coated areas, or it may involve applying a coating (colored or clear, opaque or transparent) onto substantial areas of the substrate. In either case, the process may be referred to as "printing" and the material used may be referred to as "ink." Application of brand indicia to glass bottles is one commercially important example.

In particular, the present invention deals with the application of two or more layers of organic decoration having different colors in which at least a portion of the layers overlap in direct contact with each other. For example, a colored field may first be applied to the substrate, and then lettering of a different color printed onto the first colored field. When a second decorating layer is printed onto a first decorating layer that has not been sufficiently hardened by curing, there is considerable risk that the first layer will be damaged by the second printing operation. For example, in the screen printing operations typically used in the ceramic decorating industry, contact by the screen in the second printing step often causes uncured portions of the first decorating layer to be lifted from the substrate. A common response to this problem is to cure or at least partially cure a previous decorating layer before applying a second layer, either by passing the articles being decorated through a curing oven or by specialized intermediate curing means such as ultraviolet curing. These additional steps disadvantageously add cost, complexity, and process time to the decorating process. It would be highly desirable if multilayered organic decorations could be applied to ceramic substrates without the inconvenience and cost of added steps.

In the past, glass decorations have been applied as inorganic frits, which required exposure to high temperatures in order to be fused into a durable film. Ceramic frit decorations, however, suffer from one or more disadvantages, such as the presence of heavy metals, low color brilliance, the necessity of using high temperatures to fuse the frits after application, and often a requirement to subsequently reanneal the labeled bottles. Once ceramic frit decorations are fired onto a glass surface, adhesion is usually excellent, and removal of the decoration is extremely difficult.

Organic decorations have been proposed for decorating bottles to overcome some of these problems, and particularly useful organic decorating compositions are disclosed in commonly assigned U.S. patent application Ser. No. 09/617,847 and in U.S. Pat. No. 6,214,414 B1, the disclosures of which are hereby incorporated by reference. Other organic decorating compositions are disclosed in U.S. Pat. Nos. 3,468,835; 3,471,312; 3,607,349; 5,346,933; and 5,411,768.

It is desirable for coatings applied to bottles to be tough and resistant to marring by abrasion or impact and they should be resistant to degradation by caustic solutions commonly employed for cleaning bottles.

Many earlier bottle decorating compositions were "applied ceramic labels," that is, they are applied as inorganic frits that are subsequently exposed to high temperatures. Applied ceramic labels, however, suffer from one or more disadvantages, such as the presence of heavy metals, low color brilliance, the necessity of using high temperatures to melt the frits after application, and often a requirement to subsequently reanneal the labeled bottles.

Organic compositions have been used for bottle decorating, but resistance to abrasion and impact strength of many of these coatings were typically low, and resistance to degradation by caustic bottle-cleaning solutions have often also been lower than desired. Organic bottle decorating compositions based primarily on epoxy resins, dicyandiamide curing agent, and siloxane, and usually containing various additional components, are known. See, for example, the following U.S. Pat. Nos. 3,468,835; 3,471,312; 3,607,349; 5,346,933; and 5,411,768.

SUMMARY OF THE INVENTION

A composition adapted for decorating ceramic substrates has now been found that is based upon organic binder curable by application of relatively low temperature energy and yet has sufficient integrity in the uncured state to permit applying an additional decorating layer directly onto a previously applied layer before applying the curing energy. The curing energy may include heat, but at a significantly lower temperature than required for fusing ceramic frit type decorative composition. Alternatively, the energy may comprise ultraviolet radiation. Because of the integrity of the prior-applied layer or layers, the invention permits two or more layers of decoration, typically constituting different colors, to be applied without an intervening energy-applying curing step. After all of the desired layers have been applied, curing energy may be applied to cure all of the layers with one step. This results in considerable efficiencies in an industrial decorating operation, such as glass bottle decorating.

The novel composition comprises a curable organic binder component, a colorant component, and a rigid particle component comprised of organic or inorganic particles that are substantially spherical. The particles may be polymeric (e.g., polyacrylamide) but preferably are inorganic (e.g., glass). The rigid particle component is characterized by the presence of little or no spherical particle fraction in which the diameters are substantially greater than the wet film thickness of the applied decorating layer. Typically, the wet film thickness when decorating beverage bottles is no greater than 50 microns, more typically on the order of 35 microns or less. Therefore, in those cases, the preferred decorating compositions have no substantial rigid particle content greater than 50 microns and 35 microns respectively. Wet film thicknesses for beverage bottle decorating are most commonly in the range of 15 to 35 microns, and accordingly that is also the range of average diameters of the spherical particles that will be most useful in typical commercial ceramic decorating situations. Spherical particles can also be used with diameters that are less than the layer thickness, so other embodiments may employ average diameters as low as one half or less of the wet film thickness. Although theoretically there may be no absolute minimum particle diameter that may be useful at some small film thickness, with typical commercial decorating thicknesses, the benefit may be very minor at particle diameters less than 5 microns.

Another aspect of the invention is the method of decorating a ceramic substrate by applying at least one decorating layer characterized by the spherical particle content of the compositions of the present invention. The last layer to be applied may also contain spherical particles, but since it is not subjected to the rigors of a subsequent printing operation, the topmost layer need not include the spherical particle component of the compositions of the present invention. Energy to complete the cure is utilized only after all layers have been applied, and yet the method has permitted maintaining integrity of the uncured layers during the printing steps. In accordance with this method, a multi-colored organic decoration can be applied to a ceramic substrate in a plurality of printing steps in rapid succession, followed by curing in a single step.

Screen printing processes generally involve heating the decorating composition (below the curing temperature) during the printing step in order to reduce the viscosity of the composition during printing. In the prior art, when multiple colors were applied in sequential printing steps, it was considered advisable to use progressively lower temperatures in each successive printing step to avoid damaging the previously printed layers. It is another advantage of the present invention that there is considerably greater freedom in the selection of screen temperatures in subsequent printing steps. When using the compositions of the present invention, it has been found that durability of the applied, uncured layers is sufficient to permit subsequent printing steps to be freed of restriction to lower temperatures. This property provides the operator with the advantage of selecting the temperature most appropriate for the particular decorating composition, regardless of its order in a multi-step decorating process.

DETAILED DESCRIPTION OF THE INVENTION

It is hypothesized that the beneficial effects of the present invention attributable to the inclusion of rigid spherical particles in the decorating composition is at least in part a physical phenomenon and therefore is independent of the chemical make-up of the decorating composition. Therefore, the present invention is applicable to a wide variety of organic compositions for decorating ceramics known to those of skill in the art. These are compositions that contain an organic, resinous component that is capable of being printed onto a ceramic substrate in a substantially liquid state and thereafter cured to a durable, hardened state by means of heat, UV radiation, electron beam radiation or some other form of energy that causes the resinous component to cure. Included are the prior art organic compositions disclosed in the patents cited in the Background section herein. Typically, these may include two organic components that undergo a curing reaction when the curing energy is applied. A two-component organic decorating composition employed commercially is the type employing an epoxy resin and an amine curing agent (e.g., dicyandiamide). Due primarily to the presence of the dicyandiamide curing agent, some crosslinking of prior art organic glass decorating compositions occurs at application temperatures and such crosslinking eventually causes the decorating composition to thicken to the point it cannot be applied. Accordingly, another problem with the prior coatings has been short pot life, where "pot life" is the length of time the coating will remain fluid enough to apply to substrates at application temperatures. Because it addresses the pot life problem, a particularly preferred type of decorating composition to which the present invention may be applied is that disclosed in U.S. Pat. No. 6,214,414 B1 and copending, commonly owned U.S. patent application Ser. No. 09/617,847, and the specific embodiments disclosed in detail herein are based upon that type of decorating composition. More specifically, that type of decorating composition is characterized by the inclusion of epoxy resin, amine curing agent, and a blocked isocyanate curing agent, and will be described in detail hereinbelow. Colored decorating compositions of any type additionally contain a coloring component, usually one or more pigments and/or dyes. Many other additives may be included for improving rheology, opacity, durability, lubricity, color brightness, and many other functions known to those of skill in the art.

The polyepoxy-functional reactive organic resin that may be used in preferred embodiments of the invention may be widely varied. As used herein and in the claims, the term "polyepoxy-functional" means that on a number average molecular weight basis, the resin contains, on average, more than one epoxy group per molecule. Preferably the resin contains, on average, approximately two hydroxyl groups per molecule or more. Of particular interest are the polyglycidyl ethers of polyhydric alcohols. Useful polyglycidyl ethers of polyhydric alcohols can be formed by reacting epihalohydrins, such as epichlorohydrin [CAS 106-89-8], with polyhydric alcohols, especially dihydric alcohols, in the presence of an alkali condensation and dehydrohalogenation catalyst such as sodium hydroxide or potassium hydroxide. Inasmuch as phenolic hydroxyls react with epichlorohydrin in much the same way as aliphatic alcoholic hydroxyls, compounds having at least two phenolic hydroxyls are, for purposes of the present discussion, regarded as polyhydric alcohols. Suitable polyhydric alcohols can be aromatic, aliphatic or cycloaliphatic.

Examples of suitable aliphatic polyhydric alcohols include, but are not limited to, aliphatic dihydric alcohols such as:
ethylene glycol [CAS 107-21-1],
neopentyl glycol [CAS 126-30-7],
diethylene glycol [CAS 111-46-6],
triethylene glycol [CAS 112-27-6],
tetraethylene glycol [CAS 112-60-7],
dipropylene glycol [CAS 110-98-5],
1,2-propanediol [CAS 57-55-6],
1,3-propanediol [CAS 504-63-2],
1,2-butanediol [CAS 26171-83-5],
1,3-butanediol [CAS 107-88-0],
2,3-butanediol [CAS 513-85-9],
1,4-butanediol [CAS 110-63-4],
1,2-pentanediol [CAS 5343-92-0],
1,4-pentanediol [CAS 626-95-9],
2,4-pentanediol [CAS 625-69-4],
1,5-pentanediol [CAS 111-29-5],
1,6-hexanediol [CAS 629-11-8],
3-hydroxy-2,2-dimethylpropyl 3-hydroxy-2,2-dimethylpropanoate [Ester Diol 204; CAS 1115-20-4],
poly(ethylene oxide) [CAS 25322-68-3], and
poly(propylene oxide) [CAS 25322-69-4].

Examples of suitable aliphatic polyhydric alcohols having more than two alcoholic hydroxyl groups include, but are not limited to:

sorbitol [CAS 50-70-4],
mannitol [CAS 69-65-8],
glycerol [CAS 56-81-5],
1,2,6-hexanetriol [CAS 106-69-4],
erythritol [CAS 149-32-6],
pentaerythritol [CAS 115-77-5],
dipentaerythritol [CAS 126-58-9],
tripentaerythritol [CAS 78-24-0],
1,1,1-trimethylolethane [CAS 77-85-0], and
1,1,1-trimethylolpropane [CAS 77-99-6].

Examples of suitable aromatic polyhydric alcohols include:
pyrocatechol [CAS 120-80-9],
resorcinol [CAS 108-46-3],
hydroquinone [CAS 123-31-9],
4,4'-(1-methylethylidene)bis[phenol] [bisphenol A; CAS 80-05-7],
4,4'-(1-methylethylidene))bis [2,6-dibromophenol] [tetrabromobisphenol A; CAS 79-94-7],
4,4'-(1-methylethylidene))bis[2,6-dichlorophenol] [tetrachlorobisphenol A; CAS 79-95-8],
4,4'-(1-methylpropylidene)bis[phenol] [bisphenol B; CAS 77-40-7],
4,4'-(1-methylethylidene)bis(2-methylphenol] [bisphenol C; CAS 79-97-0],
4,4'-(1,2-ethanediyl)bis[phenol] [bisphenol E; CAS 6052-84-2],
2,2'-methylenebis[phenol] [bisphenol F; CAS 2467-02-9),
4,4'-(1-methylethylidene)bis[2-(1-methylethyl)phenol] [bisphenol G; CAS 127-54-8],
4,4'-[1,3-phenylenebis(1-methylethylidene)]bis [phenol] [bisphenol M; CAS 13595-25-0],
4,4'-[1,4-phenylenebis(1-methylethylidene)]bis[phenol] [bisphenol P; CAS 2167-51-3],
4,4'-sulfonylbis[phenol] [bisphenol S; CAS 80-09-1],
4,4'-cyclohexylidenebis[phenol] [bisphenol Z; CAS 843-55-0],
4,4'-(2,4,8,10-tetraoxaspiro[5.5]undecane-3,9-diyldi-2,1-ethanediyl)bis[phenol] [bisphenol PA; CAS 3616-75-9],
4,4'-(1-phenylethylidene)bis[phenol] [bisphenol ACP; CAS 1571-75-1],
4,4'-methylenebis[phenol] [HDM; CAS 620-92-8],
2,2'-methylenebis[4-methyl-6-(1-methylethyl)phenol] [bisphenol 2246; CAS 24742-47-0],
3,3-bis(4-hydroxyphenyl)-1(3H)-isobenzofuranone [phenolphthalein; CAS 77-09-8],
4,4'-ethylidenebis[phenol] [CAS 2081-08-5],
4,4'-propylidenebis[phenol] [CAS 1576-13-2],
4,4'-(1-ethylpropylidene)bis[phenol] [CAS 3600-64-4],
4,4'-(1,4-cyclohexanediyl)bis[phenol] [CAS 10466-91-8],
4,4'-(1,3-cyclohexanediyl)bis[phenol] [CAS 55418-36-5],
4,4'-(1,2-cyclohexanediyl)bis[phenol] [CAS 55418-39-8],
4,4'-(phenylmethylene)bis [phenol] [CAS 4081-02-1],
4,4'-(2,2,2-trichloroethylidene)bis[phenol] [hydroxychlor; CAS 2971-36-0],
4-hydroxy-a-(4-hydroxyphenyl)benzeneacetic acid, butyl ester [CAS 71077-33-3],
4,4'-(diphenylmethylene)bis[phenol] [bisphenol TP; CAS 1844-01-5],
4,4'-thiobis[phenol] [CAS 2664-63-3],
1,2-dihydroxynaphthalene [CAS 574-00-5],
1,3-dihydroxynaphthalene [CAS 132-86-5],
1,4-dihydroxynaphthalene [CAS 571-60-8],
1,5-dihydroxynaphthalene [CAS 83-56-7],
1,1,3-tris(4-hydroxyphenyl)propane,
phenol-formaldehyde novolac, and
o-cresol-formaldehyde novolac.

Many ethylene oxide or propylene oxide extended aromatic polyhydric alcohols are known and may be used when desired.

Examples of suitable cycloaliphatic polyhydric alcohols include, but are not limited to:
1,2-cyclohexanediol [CAS 931-17-9],
1,3-cyclohexanediol [CAS 504-01-8],
1,4-cyclohexanediol [CAS 556-48-9],
1,2-cyclohexanedimethanol [CAS 3971-29-7],
1,3-cyclohexanedimethanol [CAS 3971-28-6],
1,4-cyclohexanedimethanol [CAS 105-08-8],
4,4'-(1-methylethylidene)bis[cyclohexanol] [hydrogenated bisphenol A; CAS 80-05-7].

Another useful class of polyepoxy-functional resins containing at least two epoxy groups per molecule, are those containing, on average, at least two epoxycycloaliphatic groups per molecule. These resins may be made by epoxidation of the cycloalkene group using a peracid such as peracetic acid.

An example of a resin that contains one epoxycycloalkyl group and a pendent epoxy group is 1-(epoxyethyl)-3,4-epoxycyclohexane [CAS 106-87-6].

Examples of epoxy-functional resins containing two or more epoxycycloalkyl groups include, but are not limited to:
bis(2,3-epoxycyclopentyl) ether [CAS 2386-90-5],
3,4-epoxycyclohexylmethyl 3',4'-epoxycyclohexanecarboxylate [CAS 2386-87-0],
bis(3,4-epoxycyclohexyl) adipate [CAS 83996-66-1], and
bis(3,4-epoxycyclohexylmethyl) 4,5-epoxycyclohexane-1,2-dicarboxylate [CAS 21678-82-0].

Poly(primary amino)-functional and poly(secondary amino)-functional compounds may be used to chain-extend the polyepoxy-functional resins.

Suitable polyepoxy-functional resins usually have an epoxide equivalent weight (i.e., molecular weight of resin per epoxide group) in the range of from 100 to 4000, as measured by titration with perchloric acid using methyl violet as an indicator. Often the polyepoxy-functional resins have an epoxide equivalent weight in the range of from 170 to 700. Preferably the epoxide equivalent weight is in the range of from 250 to 600. Other useful polyepoxides are disclosed in U.S. Pat. No. 5,820,987 at column 4, line 52 through column 6, line 59. The disclosure of U.S. Pat. No. 5,820,987 is, in its entirety, incorporated herein by reference.

Many of the polyepoxy-functional organic resins formed by reacting diols with epichlorohydrin also contain polyhydroxy-functionality. In the case of reaction of bisphenol A with epichlorohydrin, ideal reaction products having number average molecular weights of greater than 624 theoretically have, on average, two epoxy groups and more than one hydroxyl group per molecule. Examples of suitable commercially available polyepoxy-functional and polyhydroxy-functional resins are EPON® 828, 836, and 880 epoxy resins. If the number average molecular weight is 908 or greater, ideal reaction products of bisphenol A and epichlorohydrin theoretically have, on average, two epoxy groups and at least two hydroxyl group per molecule. Examples of such polyepoxy-functional and polyhydroxy-functional resins which are commercially available are EPON® 1001F, 1002, 1004, 1007, and 1009. The EPON® resins are available from Resolution Performance Products, Houston, Tex., USA.

The polyepoxy-functional resin may be reacted with various terminating agents, as for example amino-functional siloxane, to convert some, or even all, of the terminal epoxy groups to terminal groups of other functionality. In most instances, the consumption of the epoxy groups during the termination reaction is accompanied by the generation of hydroxy groups on the resin.

Reactive waxes are included in some embodiments of decorating compositions and may optionally be included in the composition of the present invention. These are long-chain aliphatic substances which have at least one reactive group having an active hydrogen, usually selected from hydroxyl, amido, ureylene, carbamyl, and carbamyloxy, and which have the physical characteristics commonly associated with waxes. The reactive waxes comprise many different classes of compounds. Examples of reactive waxes include normal primary alkanols having from 12 to 20 carbon atoms, normal primary amines having from 12 to 20 carbon atoms, normal saturated monocarboxylic acids having from 8 to 20 carbon atoms, and normal saturated monocarboxylic amides having from 8 to 20 carbon atoms. Although the normal (that is, straight chain) structures are preferred, some branching may be present, as for example isostearyl alcohol. Other examples of reactive waxes include the poly(ethylene oxides) having normal molecular weights of at least 1000, the poly(propylene oxides) having normal molecular weights of at least 5000; these may be terminated with two hydroxyl groups or with one hydroxyl group and one lower alkoxy group. Saturated long chain aliphatic diols or saturated long chain dicarboxylic acids having waxy characteristics may also be used. While saturated compounds are preferred, a small amount of unsaturation may be present, as for example oleic acid. Similarly more than one reactive group may be in the molecule, as for example 12-hydroxystearic acid and sebacic acid. Of the reactive waxes, the normal primary alkanols having from 12 to 20 carbon atoms are preferred. Stearyl alcohol is especially preferred.

Organic isocyanates react with organic compounds containing at least one "active hydrogen", i.e., a hydrogen atom replaceable by sodium. Substantially all organic compounds containing a hydrogen atom attached to oxygen or nitrogen will react with isocyanates under the proper conditions. An organic compound containing active hydrogen is suitable as a blocking agent if the product of its reaction with an isocyanate is unreactive with hydroxyl, amino, amido, ureylene, carbamyl, carbamyloxy, or other groups containing active hydrogen at room temperature, but reacts, by intermediate unblocking or otherwise, with one or more such groups of other compounds at an elevated temperature, usually in the range of from 90° C. to 325° C., to form desired products. The reaction product of a blocking agent and an isocyanate is known as a "blocked isocyanate." Although it is not desired to be bound by any theory, it is believed that the reaction to form the blocked isocyanate is reversed at the elevated temperature to regenerate isocyanato-functionality which then reacts with other compounds containing active hydrogen to form the desired products. In most instances the blocking agent contains active hydrogen attached to an oxygen atom or a nitrogen atom.

Any suitable aliphatic, cycloaliphatic, aromatic-alkyl monoalcohol or phenolic compound may be used as a blocking agent in accordance with the present invention. Examples include but are by no means limited to methyl alcohol, ethyl alcohol, chloroethyl alcohol, propyl alcohol, isopropyl alcohol, butyl alcohol, amyl alcohol, hexyl alcohol, heptyl alcohol, octyl alcohol, nonyl alcohol, 3,3,5-trimethylhexanol, decyl alcohol, lauryl alcohol, cyclopentanol, cyclohexanol, phenylcarbinol, methylphenylcarbinol, ethylene glycol monoethyl ether, ethylene glycol monobutyl ether, phenol, cresol, xylenol, nitrophenol, chlorophenol, ethylphenol, tert-butylphenol, 2,5-di-tert-butyl-4-hydroxytoluene, tertiary hydroxylamines such as diethylethanolamine, oximes such as methyl ethyl ketone oximes, acetone oxime, and cyclohexanone oxime.

Any suitable compound containing amine, amide, urea, urethane, or other groups having an active hydrogen attached to a nitrogen atom may be used. Examples of such compounds include, but are not limited to, dibutylamine, diisopropylamine, 2-phenylimidazoline, benzotriazole, benzyl methacrylohydroxamate, and ε-caprolactam.

Polyfunctional blocking agents may be used when desired. Examples include, but are not limited to ethylene glycol, propropylene glycol, poly(ethylene glycol), poly (propylene glycol), Pluronic type polypropylene, poly(tetrahydrofuran), trimethylolpropane, ethoxylated trimethylolpropane, and poly(vinyl alcohol).

Procedures for blocking isocyanato groups are well known in the art. Blocking is often accomplished by reacting the isocyanato groups of the isocyanato-functional compound with blocking agent at temperatures in the range of from 25° C. to 120° C., although other temperatures may often be used. The organic blocked isocyanate is formed by reacting a sufficient quantity of blocking agent with the organic polyisocyanate to insure that substantially no unreacted isocyanato groups are present in the product.

It should be noted that blocked isocyanato functionality does not contain the isocyanato group; rather it contains a group which is the reaction product of the isocyanato group and the blocking agent. For example, an isocyanato group blocked with an alcohol contains a urethane group, while an isocyanato group blocked with a primary amine contains a urea group.

In the preparation of the blocked organic polyisocyanates, any suitable organic polyisocyanate may be used. Examples of classes of organic polyisocyanates include, but are not limited to, the aliphatic polyisocyanates, the cycloaliphatic polyisocyanates, the aliphatic-cycloaliphatic polyisocyanates, the aromatic polyisocyanates, and the aliphatic-aromatic polyisocyanates. The polyisocyanates may be diisocyanates, triisocyanates, tetraisocyanates or higher order isocyanates.

Only one polyisocyanate or a mixture of two or more polyisocyanates may be used. When mixtures are used, the constituent polyisocyanates may be from the same class or from different classes.

Representative examples of suitable polyisocyanates include, but are not limited to, 1,2-diisocyanatopropane,
1,3-diisocyanatopropane,
1,2-diisocyanato-2-methylpropane,
1,2-diisocyanatobutane,
1,3-diisocyanatobutane,
1,4-diisocyanatobutane,
1,5-diisocyanatopentane,
1,6-diisocyanatohexane,
ethylidine diisocyanate,
butylidene diisocyanate,
1,2-diisocyanatocyclopentane,
1,3-diisocyanatocyclopentane,
1,2-diisocyanatocyclohexane,
1,3-diisocyanatocyclohexane,
1,4-diisocyanatocyclohexane,
bis(4-isocyanatocyclohexyl) ether,
1-(isocyanatomethyl)-5-isocyanato-1,3,3-trimethylcyclohexane,
1-(isocyanatomethyl)-1-(3-isocyanatopropyl)cyclohexane,
bis(4-isocyanatocyclohexyl)methane,
1,2-diisocyanatobenzene, 1,3-diisocyanatobenzene,
1,4-diisocyanatobenzene,
4,4'-diisocyanatobiphenyl,
1,4-diisocyanatonaphthalene,
1,5-diisocyanatonaphthalene,
bis(4-isocyanatophenyl)methane,
2,4-diisocyanatotoluene,
2,6-diisocyanatotoluene,
1,3-bis(isocyanatomethyl)benzene,
1,4-bis(isocyanatomethyl)benzene,
bis(4-isocyanatophenyl) ether,
3,3'-diisocyanatobiphenyl,
4,4'-diisocyanatobiphenyl,
4,4'-diisocyanato-2,2'-dimethylbiphenyl,
4,4'-diisocyanato-3,3'-dimethylbiphenyl,
4,4'-diisocyanato-2,2'-dimethoxybiphenyl,
4,4'-diisocyanato-3,3'-dimethoxybiphenyl,
tris(4-isocyanatophenyl)methane,
tris(4-isocyanatocyclohexyl)methane,
1,3,5-triisocyanatobenzene,
2,4,6-triisocyanatotoluene,
bis(2,5-diisocyanato-4-methylphenyl)methane,
bis(2,5-diisocyanato-4-methylcyclohexyl)methane, polymeric polyisocyanates such as dimers and trimers, and prepolymers which are derived from a polyol, including a hydrocarbon polyol, a polyether polyol, and a polyester polyol. An example is an adduct (approximately 3:1, molar) of 1-isocyanatomethyl-5-isocyanato-1,3,3-trimethylcyclohexane [CAS 4098-71-9] and 1,1,1-trimethylolpropane [CAS 77-99-6].

The rigid spherical particles incorporated into the decorating compositions of the present invention may be organic or inorganic. Suitable inorganic microspheres are available commercially as inert filler materials, and include glass and ceramic microspheres. "Rigid" in the expression "rigid spherical particles" herein means that they are not readily compressible. In other words, the particles have greater structural integrity that the uncured composition in which they are contained. "Solid" as used herein refers to particles that are substantially void-free. Either "solid" or hollow microspheres can be used and are encompassed by the term rigid spherical particles. Inorganic microspheres are commercially available, and may comprise ceramics or glasses, including borosilicate glass and soda lime silica glass. Organic microspheres are available made from polyurethanes, acrylics, polyamides and other polymeric materials. The very high rigidity of inorganic microspheres have been found to yield the best results. Relatively spherical shapes, as opposed to irregular granular shapes, have been found to be a factor in achieving good results in accordance with the invention. Crushed materials, such as crushed glass, and granulated materials have been found to be ineffective in achieving the results of the present invention. Absolutely spherical shapes do not appear to be essential, and it should be understood that the presence of some granular material does not defeat the advantages of the present invention.

The relatively small sizes and amounts of microspheres used in the compositions of the present invention do not produce perceptible reflectivity as in some compositions of other types that contain microspheres. The spherical particle content of the compositions here is in the range of about 5 to 50 weight percent, preferably 10 to 35 percent, most preferably 15 to 30 percent. Particle sizes vary in accordance with the thickness of the decoration layer being produced, and typically are at least 5 microns and no more than 50 microns, most typically 10 microns to 30 microns.

The relative proportions of the components of the pigmented decorating composition may be widely varied.

The reactive organic resin which is polyepoxy-functional usually constitutes from 20 to 80 percent by weight of the pigmented decorating composition. Often such reactive organic resin constitutes from 40 to 70 percent by weight of the pigmented decorating composition. From 30 to 60 percent by weight of the pigmented decorating composition is preferred.

Reactive wax may optionally constitute from 0 to 20 percent by weight of the pigmented decorating composition. In some embodiments reactive wax may constitute from 0.5 to 15 percent by weight of the pigmented decorating composition. From 1 to 10 percent by weight of the pigmented decorating composition is preferred.

The color-imparting pigment ordinarily constitutes from 1 to 45 percent by weight of the pigmented decorating composition. Frequently the color-imparting pigment constitutes from 3 to 40 percent by weight of the pigmented decorating composition. From 5 to 35 percent by weight of the pigmented decorating composition is preferred.

When present, blocked polyisocyanate may constitute from 0.5 to 15 percent by weight of the pigmented decorating composition. Frequently the blocked polyisocyanate constitutes from 1 to 10 percent by weight of the pigmented decorating composition. From 1.5 to 8 percent by weight of the pigmented decorating composition is preferred.

Illustrative amino-functional curing agents which may be used include melamine, 2,4,6-tris(alkoxycarbonylamino)-1,3,5-triazine (also known as "TACT") where each alkoxy independently contains from 1 to 4 carbon atoms, and compounds represented by the formula:

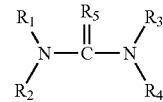

wherein:
$R_1$, $R_2$, $R_3$ each independently represents hydrogen, alkyl containing from 1 to 3 carbon atoms, or hydroxyalkyl containing from 1 to 3 carbon atoms,
$R_4$ represents hydrogen, phenyl, cyano, acetyl, or

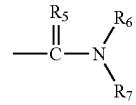

$R_5$ represents O, S, or NH, and
$R_6$ and $R_7$ each independently represents hydrogen, alkyl containing from 1 to 3 carbon atoms, hydroxyalkyl containing from 1 to 3 carbon atoms, or phenyl.

When any of $R_1$, $R_2$, $R_3$, $R_6$, and $R_7$ is alkyl containing from 1 to 3 carbon atoms, it is independently methyl, ethyl, propyl, or isopropyl. The alkyl groups may be the same or some may be different from the others. The preferred alkyl group is methyl.

When any of $R_1$, $R_2$, $R_3$, $R_6$, and $R_7$ is hydroxyalkyl containing from 1 to 3 carbon atoms, it usually is independently hydroxymethyl, hydroxyethyl, or hydroxypropyl. The hydroxyalkyl groups may be the same or some may be different from the others. The preferred hydroxyalkyl group is hydroxymethyl.

Preferably, all of $R_1$, $R_2$, $R_3$, $R_6$, and $R_7$ are hydrogen.

Examples of suitable amino-functional curing agents include melamine [CAS 108-78-1], 2,4,6-tris(methoxycarbonylamino)-1,3,5-triazine [CAS 150986-36-0], 2,4,6-tris(butoxycarbonylamino)-1,3,5-triazine [CAS 150986-45-1], dicyandiamide [CAS 461-58-5], 1,3-diphenylguanidine [CAS 102-06-7], urea [CAS 57-13-6], thiourea [CAS 62-56-6], acetylurea [CAS 591-07-1], biguanide [CAS 56-03-1], heptamethylbiguanide [CAS 91446-22-9], 2-ethyl-4-methylimidazole [CAS 931-36-2], and diaminodiphenyl sulfone [CAS 80-08-0].

The amino-functional curing agent may comprise one amino-functional curing agent compound or it may comprise a mixture of two or more amino-functional curing agent compounds.

The amino-functional curing agent usually constitutes from 1 to 25 percent by weight of the decorating composition in which it is employed. The amino-functional curing agent may constitutes from 1 to 20 percent by weight of the pigmented decorating composition in which it is employed. From 1 to 10 percent by weight of the pigmented decorating composition in which it is employed is preferred for some commercial bottle decorating embodiments.

One or more organo-functional siloxanes as are known in the art may be included in some decorating compositions and may optionally be included in the compositions of the present inventions. When present in a pigmented decorating composition, the organo-functional siloxane may constitute from 0.01 to 15 percent by weight of the pigmented decorating composition. In embodiments the organo-functional siloxane constitutes from 2 to 10 percent by weight of the pigmented decorating composition. Preferred commercial bottle decorating embodiments of the present invention do not include silane constituents.

When present in the substantially clear overcoating composition, the organo-functional siloxane usually constitutes from 0.01 to 15 percent by weight of the substantially clear overcoating composition. In many instances the organo-functional siloxane constitutes from 2 to 10 percent by weight of the substantially clear overcoating composition. From 4 to 6 percent by weight of the substantially clear overcoating composition is preferred.

Color-imparting constituents used in formulating the pigmented decorating compositions may include finely divided solid powders, insoluble but wettable under the conditions of use. They confer substantial color (which includes white, black and gray) to the pigmented decorating compositions of the invention and to coatings formed from such pigmented decorating compositions. Finely divided solid powders which do not impart substantial color to the decorating compositions and to coatings formed therefrom are, for purposes of the present invention, considered not to be pigments, but rather, they are considered to be substantially colorless fillers.

The color-imparting constituents may be widely varied. They may be organic or inorganic. It is preferred to use color-imparting pigments which do not contain heavy metals although some heavy metals such as copper which are not very toxic in the concentrations employed, may be present. In general it is preferred to use titanium dioxide as a white pigment and carbon in one of its forms as a black pigment, and to use organic pigments for imparting colors other than white, black, or gray. Examples of color-imparting pigments include, but are not limited to:

Carbon Black
Lampblack
Furnace Black
Thermal Decomposition Black
Vegetable Black
Animal Black
Bone Black
Impingement Carbon Black
Graphite
Rutile [CAS 1317-80-2]
Anatase [CAS 1317-70-0]
Clay
Aluminum Hydroxide
Pigment Black 6 [CAS 1333-86-4]
Pigment Black 7 [CAS 1333-86-4]
Pigment Black 10 [CAS 7282-42-5]
Pigment White 6 [CAS 13463-67-7]
Pigment Blue 1 [CAS 1325-87-7],
Pigment Blue 15 [CAS 147-14-8],
Pigment Blue 19 [CAS 58569-23-6],
Pigment Blue 24 [CAS 6548-12-5],
Pigment Blue 60 [CAS 81-77-6],
Pigment Green 4 [CAS 61725-50-6],
Pigment Green 7 [CAS 1328-53-6],
Pigment Green 36 [CAS 14302-13-7],
Pigment Yellow 3 [CAS 6486-23-2],
Pigment Yellow 12 [CAS 6358-85-6],
Pigment Yellow 13 [CAS 5102-83-0],
Pigment Yellow 74 [CAS 6358-31-2],
Pigment Yellow 83 [CAS 5567-15-7],
Pigment Yellow 93 [CAS 5580-57-4],
Pigment Yellow 96 [CAS 5280-80-8],
Pigment Yellow 110 [CAS 5590-18-1],
Pigment Yellow 138 [CAS 56731-19-2],
Pigment Yellow 139 [CAS 36888-99-0],
Pigment Yellow 154 [CAS 63661-02-9],
Pigment Yellow 168 [CAS 71832-85-4],
Pigment Yellow 191 [CAS 129423-54-7],
Pigment Orange 5 [CAS 3468-63-1],
Pigment Orange 13 [CAS 3520-72-7],
Pigment Orange 36 [CAS 12236-62-3],
Pigment Orange 43 [CAS 4424-06-0],
Pigment Red 2 [CAS 6041-94-7],
Pigment Red 3 [CAS 2425-85-6],
Pigment Red 5 [CAS 6410-41-9],
Pigment Red 17 [CAS 6655-84-1],
Pigment Red 23 [CAS 6471-49-4],
Pigment Red 38 [CAS 6358-87-8],
Pigment Red 52 [CAS 17852-99-2],
Pigment Red 57 [CAS 5281-04-9],
Pigment Red 112 [CAS 6535-46-2],
Pigment Red 122 [CAS 980-26-7],
Pigment Red 123 [CAS 24108-89-2],
Pigment Red 144 [CAS 5280-78-4],
Pigment Red 170 [CAS 2786-76-7],
Pigment Red 177 [CAS 4051-63-2],
Pigment Red 179 [CAS 5521-31-3],
Pigment Red 202 [CAS 68859-50-7],
Pigment Red 254 [CAS 122390-98-1],
Pigment Violet 19 [CAS 1047-16-1], and
Pigment Violet 23 [CAS 6358-30-1].

Only one color-imparting pigment or a mixture of two or more color-imparting pigments may be used.

Substantially colorless fillers are materials which may optionally be present in one or more of the pigmented decorating compositions, in the substantially clear overcoating composition, or in both the pigmented decorating compositions and in the overcoating composition. Such fillers are finely divided particulate solids which impart little or no color to the final coatings. These are in addition to the rigid spherical particle content. The fillers usually have a maximum dimension of less than 500 nanometers. Often the fillers have a maximum dimension of less than 100 nanometers. Frequently, the maximum dimension is less than 50 nanometers. In many instances the maximum dimension is less than 20 nanometers. Often the maximum dimension is in the range of from 5 to 20 nanometers. Preferably the fillers are hydrophobic. Examples of suitable hydrophobic fillers include AEROSIL® fumed silicas designated R972, R974, R812, R812S, R805 (Degussa Corporation, Ridgefield Park, N.J., USA). Only one substantially colorless filler or a mixture of two or more substantially colorless fillers may be used when desired.

When present in a pigmented decorating composition, the substantially colorless filler ordinarily constitutes from 0.01 to 20 percent by weight of the pigmented decorating composition. In many instances the substantially colorless filler constitutes from 1 to 10 percent by weight of the pigmented decorating composition. From 2 to 5 percent by weight of the pigmented decorating composition is preferred.

Many other additional materials may be optionally present in decorating compositions. Among these are dyes, antioxidants, degassing aids, flow modifiers, and fluorescent whitening agents. These are only exemplary; others may be used as desired. When present, the additional optional materials are ordinarily present in a pigmented decorating composition and/or in the substantially clear overcoating composition in their customary amounts for their customary purposes. In many instances the additional optional materials, when present, will constitute from 0.01 to 15 percent by weight of the substantially clear overcoating composition or the pigmented decorating composition. Frequently, the additional optional materials, when present, will constitute from 0.01 to 10 percent by weight of the substantially clear overcoating composition or the pigmented decorating composition.

The pigmented decorating compositions may be formed by admixing the respective ingredients at temperatures below those which would cause significant reaction.

The pigmented decorating compositions of the present invention can be applied directly to ceramic substrates and/or to one or more previously applied coatings of the same or similar pigmented decorating compositions. Usually they are applied at elevated temperatures so that the chilling effect of the cooler substrate will quickly substantially solidify the coating. Such solidification is helpful in maintaining fine-line definition, in permitting application of multiple coatings without impairing the definition of any previously applied coating, and in permitting multiple coating while avoiding energy-inefficient crosslinking between coating applications. Although the present invention lessens the need, when multiple decorating layers are applied to the same area, it is advantageous for the application temperature of a subsequently applied coating to be lower than the temperature at which a previously applied coating will liquefy or unduly soften. This will enhance preservation of the fine-line definition and resolution of the previously applied coating.

Since most of these pigmented decorating compositions substantially instantly solidify to the touch after application, they can be advantageously used in decorating lines operating at high speeds where bottles or other ceramic substrates are sequentially coated.

After the coatings have been applied, the coated ceramic substrate is heated to elevated temperatures to cure, i.e., crosslink, the coatings.

As used herein and in the claims, "ceramic substrate" is used in its broadest sense, unless otherwise more restrictively qualified. Examples of ceramic substrates include, but are not limited to, unglazed pottery, glazed pottery, unglazed earthenware, glazed earthenware, unglazed porcelain, glazed porcelain, coffee cups, tea cups, wall tiles, Christmas tree ornaments, promotional ware, and glass substrates. Examples of glass substrates include, but are not limited to, window glass, automotive glass, drinking glasses, glass bottles, glass jugs, glass jars, glass pitchers, and glass jewelry.

Application of the decorating compositions can be by any technique known to the art. Decorating compositions which are applied at elevated temperatures because they are substantially solids at room temperature are usually applied using screen decorating techniques. Decorating compositions which are liquids at room temperature can be applied by spraying, curtain coating, roller application, printing, and brushing. These techniques are only exemplary; others may be used as desired.

After all decorating layers or coatings have been applied, the decorated substrate is heated to elevated temperatures to cure, i.e., crosslink, the coatings substantially simultaneously. Curing of one or more of the applied decorating compositions is accomplished at temperatures higher than those at which the polyisocyanates were blocked. In most instances the curing temperature is at least 150° C. The curing temperature should not be so high as to cause unwanted coloration or other thermal degradation of the coatings. In typical commercial bottle decorating line, the curing temperature is in the range of from 150° C. to 200° C.

The invention is further described in conjunction with the following examples which are to be considered illustrative rather than limiting, and in which all parts are parts by weight and all percentages are percentages by weight unless otherwise specified. Examples 1, 2, 3, 4, 5, 6, 7 and 11 are embodiments in accordance with the present invention containing glass microspheres (of which Examples 1, 2, 3, 4, 5, 8 and 11 are white compositions, Example 6 is a red composition, and Example 7 is a blue composition). Example 8 is a white embodiment of the present invention containing polymeric microspheres. Example 9 is a white comparative example without microspheres which was tested in direct comparison to Example 11 using the blue top print ink composition of Example 10. Except where noted otherwise, the ingredients and procedures of each of the examples was the same as that described for Example 1.

EXAMPLE 1

|  | Weight % |
|---|---|
| EPON 880[1] | 25.22 |
| EPON 1001F[1] | 25.22 |
| Stearyl alcohol | 5.04 |
| VESTAGON B1400[2] | 5.04 |
| $TiO_2$[3] | 11.35 |
| NEO GEN DGH[4] | 4.03 |
| SPHERICEL 110P8[5] | 16.67 |
| MODAFLOW Powder III (65%)[6] | 1.89 |
| UVITEX OB[7] | 0.50 |
| BYK 405[8] | 0.46 |

-continued

|  | Weight % |
|---|---|
| DYHARD 100M[9] | 3.42 |
| AEROSIL R974[10] | 1.16 |
| Total | 100.00 |

[1] EPON ® 880 bis phenol A diglycidyl ether; EPON ® 100 1F bisphenol A diglycidyl ether [CAS 25068-38-6], Resolution Performance Products, Houston, Texas, U.S.A.
[2] VESTAGON ® B 1400, blocked polyisocyanate believed to be an adduct of isophorone diisocyanate [CAS 4098-71-9], 1,1,1-trimethylolpropane [CAS 77-99-6], and ε-caprolactam [CAS 105-60-2] in a 3:1:3 molar ratio, Degussa AG, Coatings and Colorants, Marl, Germany.
[3] TI-PURE ® R-706 titanium dioxide pigment, E.I. du Pont de Nemours & Co., Wilmington, Delaware, U.S.A.
[4] NEO GEN ™ DGH aluminum silicate, Dry Branch Kaolin Co., Dry Branch, Georgia, U.S.A.
[5] SPHERICEL 110P8 hollow borosilicate glass microspheres, 11.7 microns mean diameter, Potters Industries, Inc., Valley Forge, Pennsylvania, U.S.A.
[6] MODAFLOW ® Powder III flow modifier - ethyl acrylate-2-ethylhexyl acrylate copolymer [CAS 26376-86-3] with silicon dioxide [CAS 7631-86-9], Solutia Inc., St. Louis, Missouri, U.S.A.
[7] UVITEX OB whitening agent, 2,2'-(2,5-thiophenediyl)bis[5-(1,1-dimethylethyl)]-benzoxazole [CAS 7128-64-5], Ciba Specialty Chemieals, Basil, Switzerland.
[8] BYK ®-405 rheology control agent, solution of polyhydroxycarboxylic acid amides, BYK-Chemie, Wesel, Germany.
[9] DYHARD ® 10 0M dicyandiamide, micronised 98% <40 microns, SKW Trostberg Aktiengesellschaft, Trostberg, Germany.
[10] AEROSIL ® R974 hydrophobic fumed silica [CAS 68 611-44-9; 60 842-32-2]. Degussa AG, Frankfort am Main, Germany.

The EPON 880, EPON 1001F, stearyl alcohol and VESTAGON 1400 were placed in a container, heated in a 120° C. oven and stirred till homogenous. The mixture was cooled to ~100° C. The remainder of the materials were combined in a separate container, then added to the homogenized mixture in the first container. The combined mixture was stirred well and maintained at ~100° C. until the following step. The combined ingredients were placed in a DISPERSATOR high shear mixer from Premier Mill, Reading, Pa., USA, with a HI-VIS head, and high shear mixing was applied for 5 minutes at <100° C.

EXAMPLE 2

|  | Weight % |
|---|---|
| EPON 880 | 24.21 |
| EPON 1001F | 24.21 |
| Stearyl alcohol | 4.84 |
| VESTAGON B1400 | 4.84 |
| TiO$_2$ | 10.89 |
| NEO GEN DGH | 3.87 |
| SPHERICEL 110P8 | 20.01 |
| MODAFLOW powder III (65%) | 1.81 |
| UVITEX OB | 0.48 |
| BYK 405 | 0.45 |
| DYHARD 100M | 3.28 |
| AEROSIL R974 | 1.11 |
| Total | 100.00 |

EXAMPLE 3

|  | Weight % |
|---|---|
| EPON 880 | 24.24 |
| EPON 1001F | 24.24 |
| Stearyl alcohol | 4.85 |
| VESTAGON B1400 | 4.85 |
| TiO$_2$ | 10.91 |
| SPHERICEL 110P8 | 23.76 |
| MODAFLOW powder III (65%) | 1.81 |
| UVITEX OB | 0.48 |
| BYK 405 | 0.45 |
| DYHARD 100M | 3.28 |
| AEROSIL R974 | 1.12 |
| Total | 100.0 |

EXAMPLE 4

|  | Weight % |
|---|---|
| EPON 880 | 24.24 |
| EPON 1001F | 24.24 |
| Stearyl alcohol | 4.85 |
| EPON 1001F | 4.85 |
| TiO$_2$ | 10.91 |
| SPHERICEL 110P8 | 23.76 |
| MODAFLOW powder III (65%) | 1.81 |
| UVITEX OB | 0.48 |
| BYK 405 | 0.45 |
| DYHARD 100M | 3.28 |
| AEROSIL R974 | 1.12 |
| Total | 100.0 |

EXAMPLE 5

|  | Weight % |
|---|---|
| EPON 880 | 23.12 |
| EPON 1001F | 23.12 |
| Stearyl alcohol | 9.25 |
| EPON 1001F | 4.62 |
| TiO$_2$ | 10.41 |
| SPHERICEL 110P8 | 22.66 |
| MODAFLOW powder III (65%) | 1.73 |
| UVITEX OB | 0.46 |
| BYK 405 | 0.43 |
| DYHARD 100M | 3.13 |
| AEROSIL R974 | 1.06 |
| Total | 100.0 |

EXAMPLE 6

|  | Weight % |
|---|---|
| EPON 880 | 26.49 |
| EPON 1001F | 26.49 |

-continued

|  | Weight % |
|---|---|
| Stearyl alcohol | 5.30 |
| VESTAGON B1400 | 5.30 |
| INTERPROME 4049[11] | 3.18 |
| SPHERICEL 110P8 | 4.24 |
| SPHERICEL 110P8 | 21.72 |
| MODAFLOW powder III (65%) | 1.98 |
| BYK 405 | 0.49 |
| DYHARD 100M | 3.59 |
| AEROSIL R974 | 1.22 |
| Total | 100.0 |

[11]INTERPROME 4049 azo based naphthol red pigment from Sino, P.R. China.

EXAMPLE 7

|  | Weight % |
|---|---|
| EPON 880 | 25.94 |
| EPON 1001F | 25.94 |
| Stearyl alcohol | 5.19 |
| VESTAGON B1400 | 5.19 |
| Palomar Blue B4714[12] | 5.19 |
| SPHERICEL 110P8 | 25.42 |
| MODAFLOW powder III (65%) | 1.94 |
| BYK 405 | 0.48 |
| DYHARD 100M | 3.51 |
| AEROSIL R974 | 1.19 |
| Total | 100.0 |

[12]Palomar Blue phthalocyanine blue pigment, Bayer Corporation, Pittsburgh, Pennsylvania, U.S.A.

EXAMPLE 8

|  | Weight % |
|---|---|
| EPON 880 | 24.24 |
| EPON 1001F | 24.24 |
| Stearyl alcohol | 4.85 |
| VESTAGON B1400 | 4.85 |
| $TiO_2$ | 10.91 |
| ORGASOL Polyamide 1002D Nat 1[13] | 23.76 |
| MODAFLOW powder III (65%) | 1.81 |
| UVITEX OB | 0.48 |
| BYK 405 | 0.45 |
| DYHARD 100M | 3.28 |
| AEROSIL R974 | 1.12 |
| Total | 100.0 |

[13]ORGASOL ® 1002 D NAT polyamide microspheres, 20 micron particle diameter, Atofina Chemicals, Philadelphia, Pennsylvania, U.S.A.

EXAMPLE 9

| (Comparative white ink without spherical particles) | |
|---|---|
|  | Weight % |
| EPON 1001F | 30.60 |
| EPON 880 | 30.60 |
| Stearyl Alcohol | 6.12 |
| VESTAGON B 1400 | 6.12 |
| $TiO_2$ | 13.77 |
| MODAFLOW Powder III | 2.29 |
| UVITEX | 0.61 |
| NEO GEN DGH | 4.90 |
| BYK 405 | 0.55 |
| DYHARD 100M | 3.06 |
| AEROSIL R-974 | 1.39 |
| Total | 100.00 |

The EPON 880, EPON 1001F, stearyl alcohol and VESTAGON 1400 were placed in a container, heated in a 120° C. oven and stirred till homogenous. The mixture was cooled to ~100° C. The remainder of the materials were combined in a separate container, then added to the homogenized mixture in the first container. The combined mixture was stirred well and maintained at ~100° C. until the following step. The combined ingredients were placed in a DISPERSATOR high shear mixer from Premier Mill, Reading, Pa., USA, with a HI-VIS head, and high shear mixing was applied for 5 minutes at <100° C.

EXAMPLE 10

| (Colored ink for top print) | |
|---|---|
|  | Weight % |
| EPON 880 | 35.39 |
| EPON 1001F | 35.39 |
| Stearyl alcohol | 7.08 |
| GEODE V-9250 Blue[14] | 15.01 |
| CROMOPHTAL Violet GT[15] | 0.28 |
| $TiO_2$ | 1.34 |
| MODAFLOW Powder III | 2.51 |
| BYK 405 | 0.35 |
| DYHARD 100M | 1.77 |
| AEROSIL R974 | 0.87 |
| Total | 100.00 |

[14]GEODE V-9250 Blue pigment from Ferro Corporation.
[15]CROMOPHTAL Violet GT dioxazine type pigment from Ciba.

EXAMPLE 11

| (White ink in accordance with invention) | |
|---|---|
|  | Weight % |
| EPON 880 | 23.28 |
| EPON 1001F | 25.61 |
| Stearyl alcohol | 4.66 |
| VESTAGON B1400 | 2.33 |
| $TiO_2$ | 14.90 |
| SPHERICEL 110P8 | 22.81 |

-continued (White ink in accordance with invention)

| | Weight % |
|---|---|
| MODAFLOW Powder III (65%) | 1.74 |
| UVITEX OB | 0.47 |
| BYK 405 | 0.28 |
| DYHARD 100M | 3.24 |
| AEROSIL R974 | 0.70 |
| Total | 100.0 |

The white compositions prepared in Examples 9 and 11 were printed as a design on glass bottles using a Strutz GP-4 Semi-Automatic General Purpose Decorator. A stainless steel screen of 180 mesh was used and the white decorating compositions were printed at temperatures in the range of from 80° C. to 85° C. A portion of the blue ink composition prepared in Example 10 was substantially immediately printed as a design, partially on each of the white coatings previously applied to the glass bottles, using a second screen printing pass of the same decorating machine. For printing the blue composition, a stainless steel screen of 230 mesh was used at temperatures in the range of from 58° C. to 63° C. The printed bottles were subsequently cured in a forced air oven at 180° C. for one hour. With the bottles printed with the white composition of Example 9, white areas had been lifted from most of the bottles during the blue printing step. The removal was sufficient in most cases to make small lettering illegible. With the white composition of Example 11, a run of 1000 bottles showed no damage to the white design cased by the blue printing step. All lettering was substantially intact with the composition of Example 11.

Other than in the operating examples, or where otherwise indicated, all numbers expressing quantities of ingredients or reaction conditions used herein are to be understood as modified in all instances by the term "about".

Although the present invention has been described with reference to specific details of certain embodiments thereof, it is not intended that such details should be regarded as limitations upon the scope of the invention except insofar as they are included in the accompanying claims.

Therefore, what is claimed is:

1. A pigmented curable composition adapted for decorating ceramic substrates, said composition comprising: curable organic binder; and 5 to 50 weight percent rigid substantially spherical organic particles having average diameters of 5 to 50 microns, percentages based upon total weight of the composition, wherein the particles comprise polyamide.

2. A pigmented curable composition comprising curable organic binder; and 5 to 50 weight percent rigid substantially spherical glass particles having average diameters of 5 to 50 microns, percentages based upon total weight of the composition; a reactive wax selected from the group consisting of normal primary alkanol having from 12 to 20 carbon atoms, normal saturated monocarboxylic acid having from 8 to 20 carbon atoms, and normal saturated monocarboxylic amide having from 8 to 20 carbon atoms.

3. The composition of claim 2 wherein the reactive wax comprises stearyl alcohol.

4. A pigmented curable composition adapted for decorating ceramic substrates, comprising a curable organic binder, and 5 to 50 weight percent rigid substantially spherical particles having diameters of 5 to 50 microns, percentages based upon total weight of the composition, wherein the curable organic binder further comprises polyepoxy-functional reactive resins, blocked polyisocyanate, and an amino-functional curing agent selected from the group consisting of melamine, 2,4,6-tris(alkoxycarbonylamino)-1,3,5-triazine where each alkoxy independently contains from 1 to 4 carbon atoms, a compound represented by the formula:

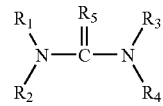

wherein: $R_1$, $R_2$, and $R_3$ each independently represents hydrogen, alkyl containing from 1 to 3 carbon atoms, or hydroxyalkyl containing from 1 to 3 carbon atoms, $R_4$ represents hydrogen, phenyl, cyano, acetyl, or

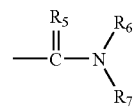

R5 represents O,S, or NH, and $R_6$ and $R_7$ each independently represents hydrogen, alkyl containing from 1 to 3 carbon atoms, hydroxyalkyl containing from 1 to 3 carbon atoms, or phenyl, a mixture of two or more thereof.

5. A pigmented curable composition adapted for decorating ceramic substrates, said composition comprising:
reactive organic resin component in which epoxy groups comprise the major reactive functionality; and
amino-functional curing agent;
blocked polyisocyanate; and
5 to 50 weight percent rigid substantially spherical particles having average diameters of 5 to 50 microns, percentages based upon total weight of the composition.

6. The composition of claim 5 wherein the particles are glass.

7. The composition of claim 6 wherein the particles are solid.

8. The composition of claim 6 wherein the particles are hollow.

9. The composition of claim 5 wherein the particles are organic.

10. The composition of claim 9 wherein the particles comprise polyamide.

11. The composition of claim 5, wherein the rigid substantially spherical particle content is 10 to 35 weight percent.

12. The composition of claim 5, wherein the rigid substantially spherical particle content is 15 to 30 weight percent.

13. A pigmented curable composition adapted for decorating ceramic substrates, said composition comprising:
30 to 60 weight percent of a compound having reactive epoxy groups;
1 to 10 weight percent amino-functional curing agent;
1 to 15 weight percent blocked polyisocyanate; and
5 to 50 weight percent rigid substantially spherical particles having diameters of 5 to 50 microns;
wherein the percentages are based upon total weight of the composition.

14. The composition of claim 13 wherein the particles are glass.

15. The composition of claim 14, wherein the particles are solid.

16. The composition of claim 14 wherein the particles are hollow.

17. The composition of claim 13 wherein the particles are organic.

18. The composition of claim 17 wherein the particles comprise polyamide.

19. The composition of claim 13, wherein the rigid substantially spherical particle content is 10 to 35 weight percent.

20. The composition of claim 13, wherein the rigid substantially spherical particle content is 15 to 30 weight percent.

21. A method for decorating a ceramic substrate comprising:
applying a first decorating composition comprising curable organic binder and containing 5 to 50 percent rigid substantially spherical particles having diameters of 5 to 50 microns to form a first layer overlying at least a portion of the substrate;
applying a second decorating composition different from the first decorating composition and comprising curable organic binder to form a second layer contacting at least a portion of the first layer.

22. The method of claim 21 wherein said second decorating composition contains 5 to 50 percent rigid substantially spherical particles having diameters of 5 to 50 microns; and the method further comprises applying a third decorating composition different from the second decorating composition and comprising curable organic binder to form a third layer contacting at least a portion of either the first layer or the second layer or both.

23. The method of claim 21 wherein the curable organic binder comprises polyepoxy-functional reactive organic resin.

24. The method of claim 23 wherein the curable organic binder further comprises blocked polyisocyanate.

25. The method of claim 24 wherein curable organic binder further comprises amino-functional curing agent selected from the group consisting of melamine, 2,4,6-tris (alkoxycarbonylamino)-1,3,5-triazine where each alkoxy independently contains from 1 to 4 carbon atoms, a compound represented by the formula:

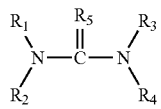

wherein:
R1, R2, and R3 each independently represents hydrogen, alkyl containing from 1 to 3 carbon atoms, or hydroxyalkyl containing from 1 to 3 carbon atoms,
R4 represents hydrogen, phenyl, cyano, acetyl, or

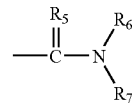

R5 represents O, S, or NH, and
R6 and R7 each independently represents hydrogen, alkyl containing from 1 to 3 carbon atoms, hydroxyalkyl containing from 1 to 3 carbon atoms, or phenyl, and a mixture of two or more thereof.

26. The method of claim 25 wherein the amino-functional curing agent comprises dicyandiamide.

27. The method of claim 21 further comprising curing the first and second applied layers substantially simultaneously.

28. The method of claim 27 wherein the curing is effected by means of elevated temperature of at least 150° C.

29. The method of claim 27 wherein the curing is effected by means of elevated temperature in the range of from 150° C. to 200° C.

30. The method of claim 27 wherein the curing is effected by means of ultraviolet radiation.

31. The method of claim 27 wherein the curing is effected by means of electron beam irradiation.

32. The method of claim 21 wherein the ceramic substrate is glass.

33. The method of claim 21 wherein the ceramic substrate is a glass bottle.

34. The method of claim 21 wherein the first and second compositions are applied by means of screen printing.

35. The method of claim 34 wherein the first and second compositions are heated during screen printing to a temperature below the curing temperature of the compositions.

36. The composition of claim 21, wherein the rigid substantially spherical particle content is 10 to 35 weight percent.

37. The composition of claim 21, wherein the rigid substantially spherical particle content is 15 to 30 weight percent.

38. A pigmented curable composition adapted for decorating ceramic substrates, said composition comprising: curable organic binder; and 5 to 50 weight percent rigid substantially spherical organic particles having average diameters of 5 to 50 microns, percentages based upon total weight of the composition, further including a reactive wax selected from the group consisting of normal primary alkanol having from 12 to 20 carbon atoms, normal saturated monocarboxylic acid having from 8 to 20 carbon atoms, and normal saturated monocarboxylic amide having from 8 to 20 carbon atoms.

39. The composition of claim 38, wherein the reactive wax comprises stearyl alcohol.

40. A pigmented curable composition comprising: a curable organic binder; and 5 to 50 weight percent rigid substantially spherical organic particles having average diameters of 5 to 50 microns, percentages based upon total weight of the composition, wherein the curable organic binder further comprises blocked polyisocyanate.

* * * * *